US008476688B2

United States Patent
Cho et al.

(10) Patent No.: US 8,476,688 B2
(45) Date of Patent: Jul. 2, 2013

(54) SEMICONDUCTOR DEVICE AND METHOD FOR MANUFACTURING THE SAME, WHICH PREVENTS LEANING OF A STORAGE NODE WHEN FORMING A CAPACITOR HAVING A PLURALITY OF STORAGE NODES OF "L" OR "+" SHAPE SUPPORT PATTERNS

(75) Inventors: Ho Jin Cho, Gyeonggi-do (KR); Cheol Hwan Park, Gyeonggi-do (KR); Jae Wook Seo, Seoul (KR); Jong Kuk Kim, Gyeonggi-do (KR)

(73) Assignee: Hynix Semiconductor Inc., Gyeonggi-do (KR)

( * ) Notice: Subject to any disclaimer, the term of this patent is extended or adjusted under 35 U.S.C. 154(b) by 658 days.

(21) Appl. No.: 12/244,115

(22) Filed: Oct. 2, 2008

(65) Prior Publication Data
US 2009/0206448 A1    Aug. 20, 2009

(30) Foreign Application Priority Data
Feb. 20, 2008    (KR) .................... 10-2008-0015520

(51) Int. Cl.
*H01L 31/113*    (2006.01)
(52) U.S. Cl.
USPC .... 257/306; 257/211; 257/773; 257/E29.001; 257/E21.001; 438/239; 438/243; 438/386; 438/397; 361/272

(58) Field of Classification Search
USPC ............ 257/68–70, 71, 296–313, 532, 535, 257/E29.001, E21.001, 211, 773; 438/239, 438/381, 386, 243, 397; 361/272
See application file for complete search history.

(56) References Cited

U.S. PATENT DOCUMENTS

| | | | |
|---|---|---|---|
| 2005/0054159 A1* | 3/2005 | Manning et al. | 438/253 |
| 2006/0099768 A1* | 5/2006 | Yokoi | 438/381 |
| 2009/0068814 A1* | 3/2009 | Cho et al. | 438/386 |
| 2009/0184393 A1* | 7/2009 | Chen et al. | 257/532 |
| 2010/0134950 A1* | 6/2010 | Choi et al. | 361/301.4 |

FOREIGN PATENT DOCUMENTS

| | | | | |
|---|---|---|---|---|
| KR | 1020040000069 A | * | 1/2004 | |
| KR | 1020050083426 A | * | 8/2005 | |
| KR | 1020050115471 A | * | 12/2005 | |
| KR | 1020060007727 A | | 1/2006 | |
| KR | 1020060007727 A | * | 1/2006 | |
| KR | 1020080012536 A | | 2/2008 | |

* cited by examiner

*Primary Examiner* — N Drew Richards
*Assistant Examiner* — John P Dulka
(74) *Attorney, Agent, or Firm* — Ladas & Parry LLP

(57) ABSTRACT

A semiconductor device that prevents the leaning of storage node when forming a capacitor having high capacitance includes a plurality of cylinder-shaped storage nodes formed over a semiconductor substrate; and support patterns formed to fix the storage nodes in the form of an 'L' or a '+' when viewed from the top. This semiconductor device having support patterns in the form of an 'L' or a '+' reduces stress on the storage nodes when subsequently forming a dielectric layer and plate nodes that prevents the capacitors from leaking.

20 Claims, 15 Drawing Sheets

SEMICONDUCTOR DEVICE AND METHOD FOR MANUFACTURING THE SAME, WHICH PREVENTS LEANING OF A STORAGE NODE WHEN FORMING A CAPACITOR HAVING A PLURALITY OF STORAGE NODES OF "L" OR "+" SHAPE SUPPORT PATTERNS

CROSS-REFERENCE TO RELATED APPLICATIONS

The present application claims priority to Korean patent application number 10-2008-0015520 filed on Feb. 20, 2008, which is incorporated herein by reference in its entirety.

BACKGROUND OF THE INVENTION

The present invention relates generally to a semiconductor device and a method for manufacturing the same, and more particularly to a semiconductor device and a method for manufacturing the same for preventing the leaning of storage nodes.

With increasing demand for semiconductor memory devices, various techniques for obtaining a capacitor having high capacitance have been proposed in the art. The capacitor has a structure in which a dielectric is interposed between storage nodes and plate nodes. As understood by ones skilled in the art, the capacitance of the capacitor is proportional to the surface area of an electrode and the dielectric constant of the dielectric and is inversely proportional to the distance between electrodes, that is, the thickness of the dielectric.

Therefore, in order to obtain a capacitor having high capacitance, it is necessary to use a dielectric having high dielectric constant, increase the surface area of an electrode, or decrease the distance between electrodes. In this regard, limitations exist in decreasing the distance between electrodes, that is, the thickness of the dielectric. Therefore, research for forming a capacitor having high capacitance is mainly directed toward using a dielectric having high dielectric constant or increasing the surface area of an electrode.

As a method for increasing the surface area of an electrode, a capacitor can be formed in a concave type or a cylinder type. In comparison between these two types, the cylinder type capacitor has the wide surface area of an electrode when compared to the concave type capacitor because the cylinder type has a CIAIC (cathode-insulator-anode-insulator-cathode) structure in which both surfaces of a storage node can be utilized. Therefore, the cylinder type capacitor has advantages when applied to a highly integrated semiconductor device.

Hereafter, a conventional method for manufacturing a semiconductor device having cylinder-shaped capacitors will be briefly described.

After forming an interlayer dielectric on a semiconductor substrate, storage node contact plugs are formed in the interlayer dielectric. After forming a mold insulation layer for serving as a mold for forming storage nodes on the interlayer dielectric including the storage node contact plugs, by etching the mold insulation layer, holes are defined to expose the storage node contact plugs.

After forming a conductive layer for storage nodes on the mold insulation layer including the surfaces of the holes, storage nodes are formed by removing portions of the conductive layer for storage nodes which are formed on the mold insulation layer. Then, the mold insulation layer that served as the mold for forming the storage nodes is removed. Thereafter, the cylinder-shape capacitors are formed by sequentially forming a dielectric and plate nodes on the storage nodes.

However, in the conventional art, as the size of cells decreases in order to accommodate the trend toward the high integration of semiconductor devices, not only does the aspect ratio of the storage nodes increases, but also the space between storage nodes becomes narrow. As a result, the leaning phenomenon of the storage nodes occurs.

Therefore, the conventional art disclosed a method of forming support patterns for fixing the storage nodes in the form of a quadrangle or a straight line when viewed from the top.

However, when fixing the storage nodes in the form of a quadrangle, the support patterns are weak that causes the storage nodes to lean. Also, when the storage nodes are in the form of a quadrangle, the support patterns are likely to separate from the storage nodes. This separation causes defects in subsequent processes.

Further, when fixing the storage nodes in the form of a straight line, cracks are likely to occur between the support patterns and the storage nodes. These cracks are caused by the stress produced from depositing a dielectric and a conductive layer for plate nodes. As a result, the breakdown voltage of the capacitors decrease, and capacitance often leak.

SUMMARY OF THE INVENTION

Embodiments of the present invention are directed to a semiconductor device and a method for manufacturing the same which prevents the leaning of storage nodes.

In one aspect of the present invention, a semiconductor device comprises a plurality of cylinder-shaped storage nodes formed over a semiconductor substrate; and support patterns formed to fix the storage nodes in a form of an 'L' when viewed from above.

The support patterns comprise any one of a nitride layer and an undoped polysilicon layer.

The support patterns are formed such that each of the support patterns fixes a plurality of at least 8 storage nodes together.

In another aspect of the present invention, a method for manufacturing a semiconductor device comprises the forming an insulation layer having a stack structure wherein a support layer is placed over a semiconductor substrate; defining a plurality of holes by etching the insulation layer and the support layer; forming cylinder-shaped storage nodes in the holes; forming support patterns by etching the insulation layer and the support layer to fix the storage nodes in the form of an 'L' when viewed from above; and removing the remaining insulation layer after forming the support patterns.

The support layer is formed as any one of a nitride layer and an undoped polysilicon layer.

The nitride layer is formed in a furnace or through plasma-enhanced chemical vapor deposition (PE-CVD) or HDP-CVD high density plasma chemical vapor deposition (HDP-CVD).

After the forming the storage nodes and before the forming the support patterns, the method further comprises annealing the semiconductor substrate which is formed with the storage nodes.

The annealing is conducted in an $N_2$ atmosphere.

The forming the support patterns comprises the forming a capping layer on the insulation layer, which also includes the storage nodes; forming mask patterns on the capping layer having an 'L' shape when viewed from above; etching portions of the capping layer, the insulation layer and the support layer using the mask patterns as an etch mask; and removing the mask patterns and the capping layer.

The capping layer is formed as an oxide layer.

The oxide layer is formed as any one of a plasma-enhanced tetraethyl orthosilicate (PE-TEOS) layer and an atomic layer deposition (ALD)-$SiO_2$ layer.

The support patterns are formed such that each of the support patterns fixes a plurality of at least 8 storage nodes together.

In another aspect of the present invention, a semiconductor device comprises a plurality of cylinder-shaped storage nodes formed over a semiconductor substrate; and support patterns formed to fix the storage nodes in the form of a '+' when viewed from above.

The support patterns comprise any one of a nitride layer and an undoped polysilicon layer.

The support patterns are formed such that each of the support patterns fixes a plurality of at least 8 storage nodes together.

In a further aspect of the present invention, a method for manufacturing a semiconductor device comprises the forming an insulation layer having a stack structure wherein a support layer is placed over a semiconductor substrate; defining a plurality of holes by etching the insulation layer and the support layer; forming cylinder-shaped storage nodes in the holes; forming support patterns by etching the insulation layer and the support layer to fix the storage nodes in the form of a '+' when viewed from above; and removing the remaining insulation layer after forming the support patterns.

The support layer is formed as any one of a nitride layer and an undoped polysilicon layer.

The nitride layer is formed in a furnace or through PE-CVD or HDP-CVD.

After the forming the storage nodes and before the forming the support patterns, the method further comprises annealing the semiconductor substrate which is formed with the storage nodes.

The annealing is conducted in an $N_2$ atmosphere.

The forming the support patterns comprises the forming a capping layer on the insulation layer which also includes the storage nodes; forming mask patterns on the capping layer having a '+' shape when viewed from above; etching portions of the capping layer, the insulation layer and the support layer using the mask patterns as an etch mask; and removing the mask patterns and the capping layer.

The capping layer is formed as an oxide layer.

The oxide layer is formed as any one of a PE-TEOS layer and an ALD-$SiO_2$ layer.

The support patterns are formed such that each of the support patterns fixes a plurality of at least 8 storage nodes together.

DESCRIPTION OF SPECIFIC EMBODIMENTS

In the present invention, support patterns for fixing storage node are formed by manufacturing a semiconductor device having cylinder-shaped capacitors. The support patterns are formed to fix a plurality of storage nodes in the form of an 'L' or a '+' when viewed from the top.

Accordingly, it is possible to prevent the storage nodes from leaning while conducting a wet dip-out process for removing an insulation layer. Thus, the capacitance of the capacitors is secured, and the manufacturing yield of a semiconductor device is increased.

Hereafter, the specific embodiments of the present invention will be described in detail with reference to the accompanying drawings.

Figure 1:
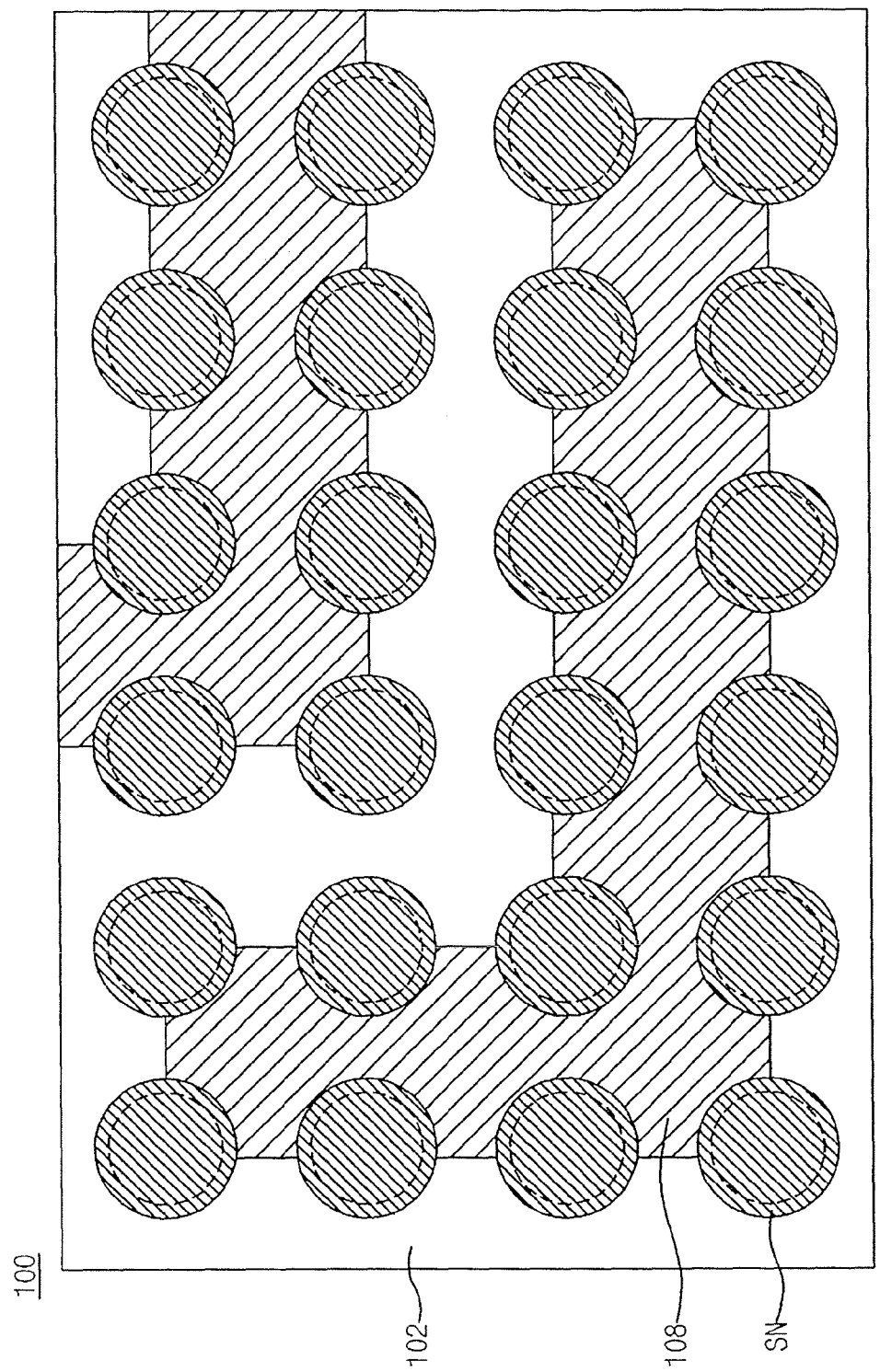
FIG. 1 is a plan view illustrating a semiconductor device in accordance with one embodiment of the present invention.

FIG. 1 is a plan view illustrating a semiconductor device in accordance with one embodiment of the present invention.

Referring to FIG. 1, an interlayer dielectric 102 is formed on a semiconductor substrate 100, and storage node contact plugs (not shown) are formed in the interlayer dielectric 102. A plurality of cylinder-shaped storage nodes SN are formed on the storage node contact plugs.

Support patterns 108 are formed on the semiconductor substrate 100 which is formed with the storage node contact plugs and the storage nodes SN, to fix the storage nodes SN in the form of an 'L' when viewed from the top. Here, the support patterns 108 comprise any one of a nitride layer and an undoped polysilicon layer and are formed each to fix 16 storage nodes SN.

Therefore, the semiconductor device in accordance with one embodiment of the present invention has the support patterns 108 which fix the storage nodes SN in the form of an 'L' when viewed from the top. Accordingly, it is possible to prevent the storage nodes SN from leaning.

Meanwhile, in a semiconductor device in accordance with another embodiment of the present invention, support patterns can be formed each to fix 8 storage nodes in the form of an 'L' when viewed from the top.

Figure 2:
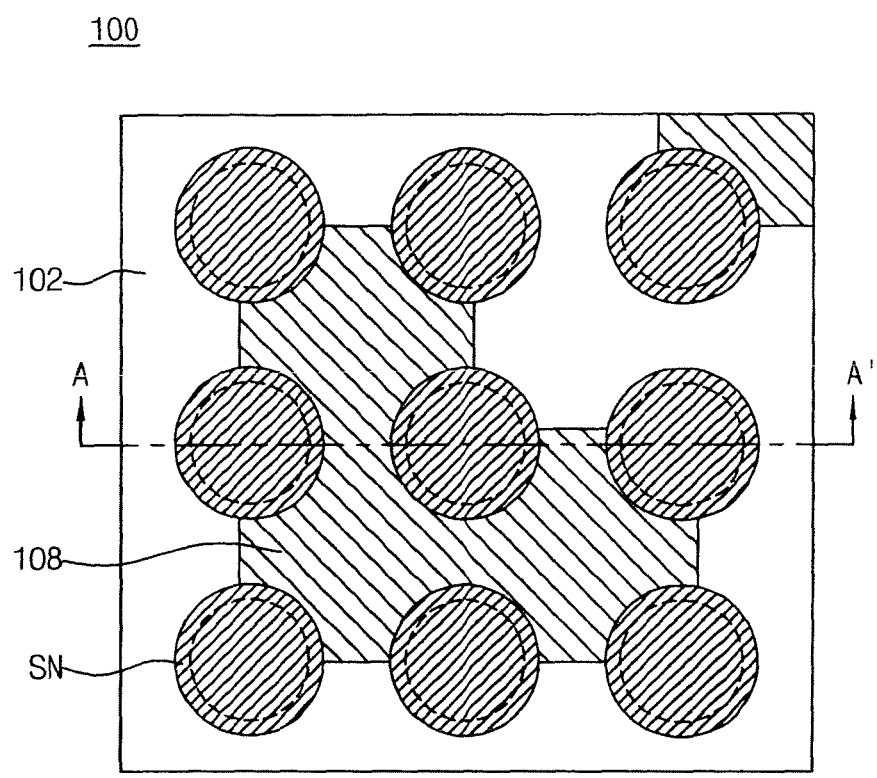
FIG. 2 is a plan view illustrating a semiconductor device in accordance with another embodiment of the present invention.

FIG. 2 is a plan view illustrating a semiconductor device in accordance with another embodiment of the present invention.

Referring to FIG. 2, support patterns 108 are formed on a semiconductor substrate 100 to fix storage nodes SN in the form of an 'L' when viewed from the top. The support patterns 108 are formed each to fix 8 storage nodes SN.

FIGS. 3A through 3H are sectional views taken along the line A-A' of FIG. 2, illustrating the processes of a method for manufacturing a semiconductor device in accordance with another embodiment of the present invention.

Figure 3A:
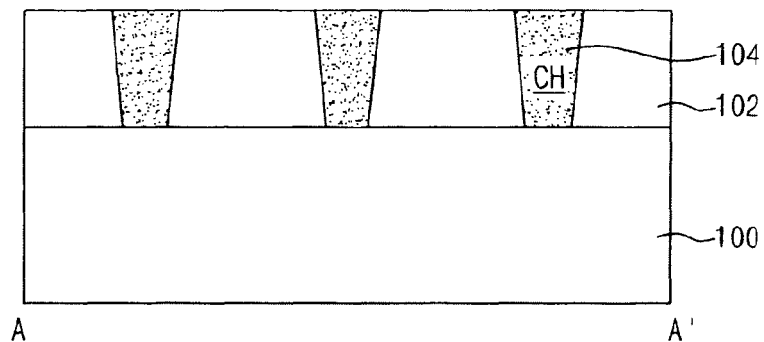
FIGS. 3A through 3H are sectional views taken along the line A-A' of FIG. 2, illustrating the processes of a method for manufacturing a semiconductor device in accordance with another embodiment of the present invention.

Referring to FIG. 3A, after forming an interlayer dielectric 102 on a semiconductor substrate 100, contact holes CH are defined by etching the interlayer dielectric 102. A conductive layer, for example, a polysilicon layer is formed on the interlayer dielectric 102 to fill the contact holes CH. Preferably, the polysilicon layer is formed, for example, through a chemical vapor deposition (CVD) process. Then, by etching back the polysilicon layer formed on the interlayer dielectric 102, storage node contact plugs 104 are formed in the contact holes CH.

Figure 3B:
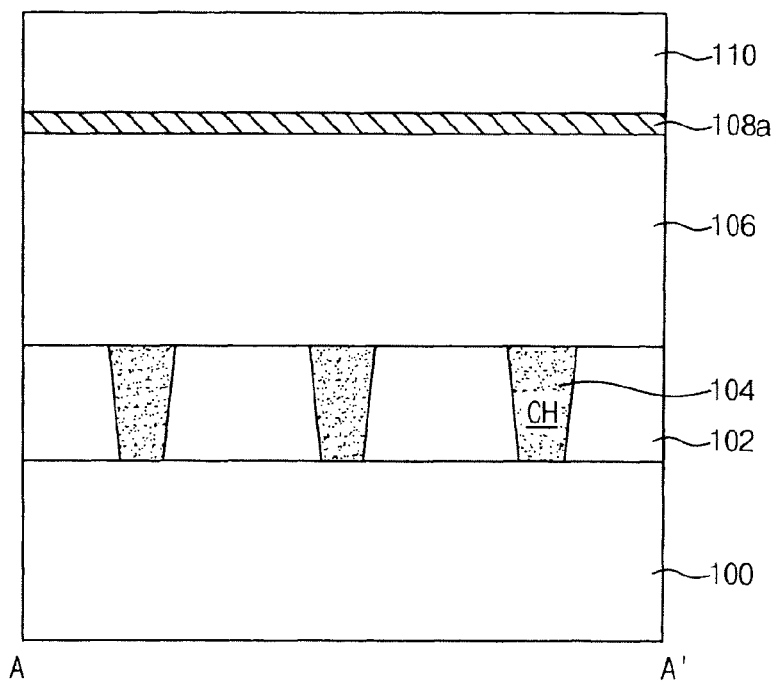

Referring to FIG. 3B, a first insulation layer 106, a support layer 108a and a second insulation layer 110 are formed on the storage node contact plugs 104 and the interlayer dielectric 102. The first and second insulation layers 106 and 110 comprise an oxide layer, for example, a single layer of a phosphosilicate glass (PSG) layer or a plasma-enhanced tetraethyl orthosilicate (PE-TEOS) layer or a stack layer of PSG and PE-TEOS layers. Alternatively, an etch stop layer (not shown) comprising a nitride layer can be formed before forming the first insulation layer 106.

Here, the support layer 108a is formed as any one of a nitride layer and an undoped polysilicon layer. The nitride layer is formed in a furnace or through any one of plasma-enhanced chemical vapor deposition (PE-CVD) or high density plasma chemical vapor deposition (HDP-CVD).

Figure 3C:
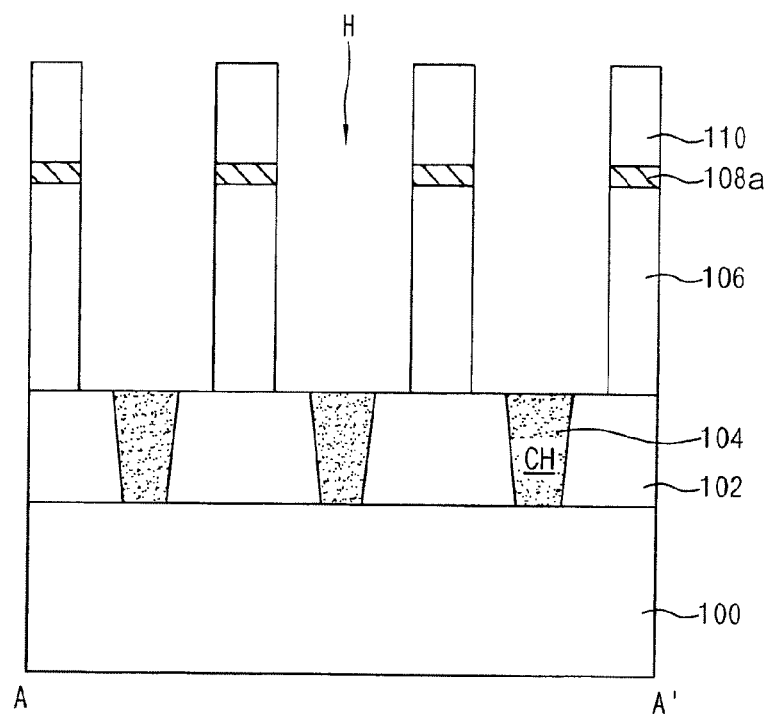

Referring to FIG. 3C, a plurality of holes H for storage nodes are defined to expose the storage node contact plugs 104 by etching the second insulation layer 110, the support layer 108a and the first insulation layer 106.

Figure 3D:
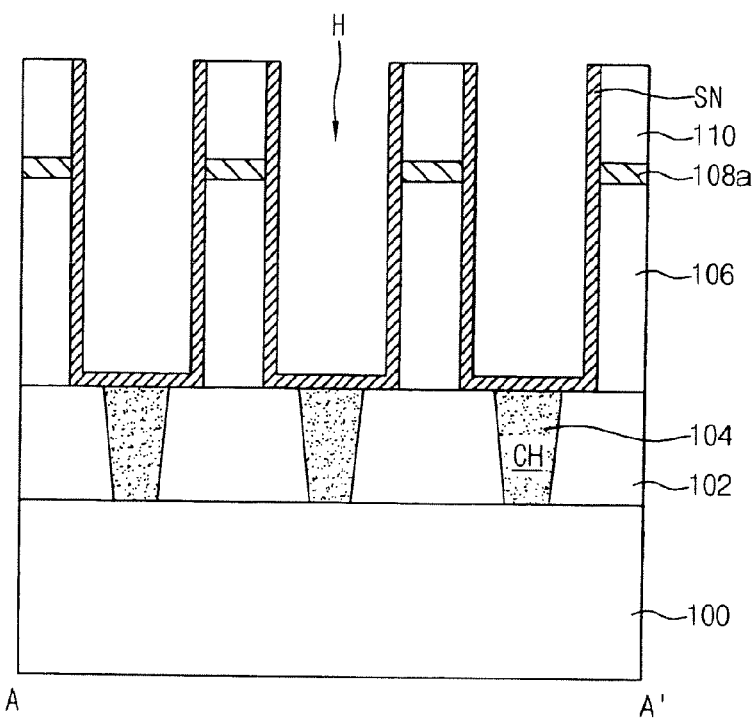

Referring to FIG. 3D, a conductive layer for storage nodes is formed on the second insulation layer 110 including the holes H for storage nodes. The conductive layer for storage nodes has the stack structure of a TiN layer and a Ti layer. The TiN layer is formed, for example, through CVD, and the Ti layer is formed, for example, through physical vapor deposition (PVD). Preferably, rapid thermal annealing is conducted such that a $TiSi_2$ layer (not shown) for ohmic contact is formed at an interface between the conductive layer for storage nodes and the storage node contact plugs 104.

Cylinder-shaped storage nodes SN are formed in the holes H for storage nodes by removing portions of the conductive layer for storage nodes formed on the second insulation layer 110 in succession. The removal of the portions of the conductive layer for storage nodes is performed, for example, through a chemical mechanical polishing (CMP) process or an etch-back process. The storage nodes SN are formed on the sidewalls of the second insulation layer 110, the support layer 108a and the first insulation layer 106 which delimit the holes H for storage nodes and on the storage node contact plugs 104.

Figure 3E:
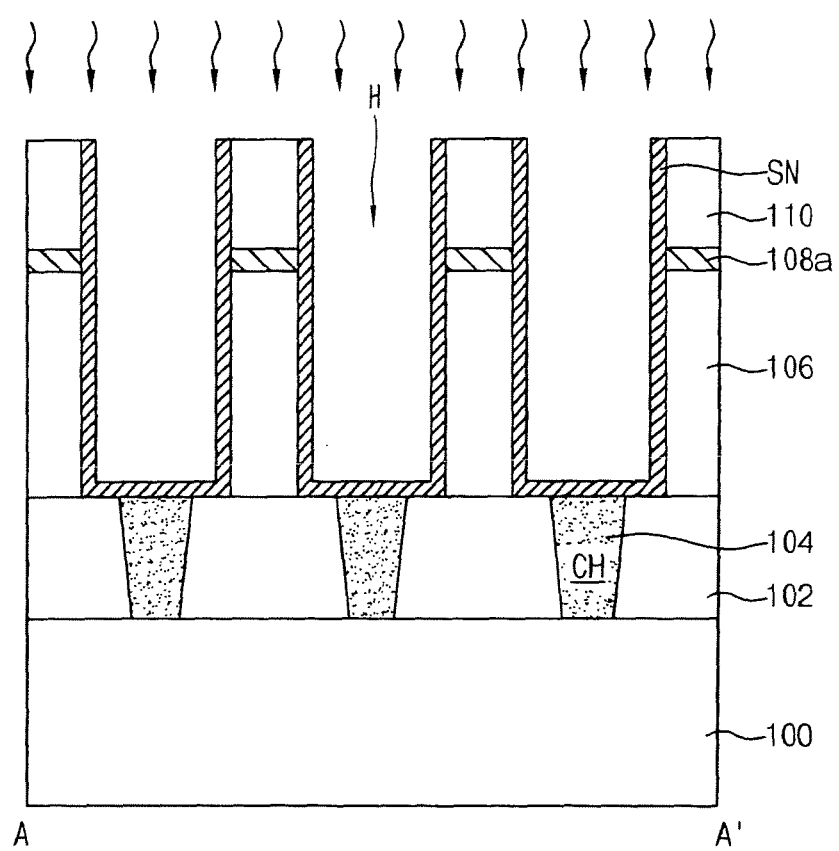

Referring to FIG. 3E, the semiconductor substrate 100 which is formed with the storage nodes SN is annealed. The annealing is conducted to remove impurities, such as Cl, contained in the storage nodes SN and to decrease the stress. This stress is produced from the rapid thermal annealing when forming the $TiSi_2$ layer for the ohmic contact. Preferably, the annealing is conducted in an $N_2$ atmosphere.

Figure 3F:
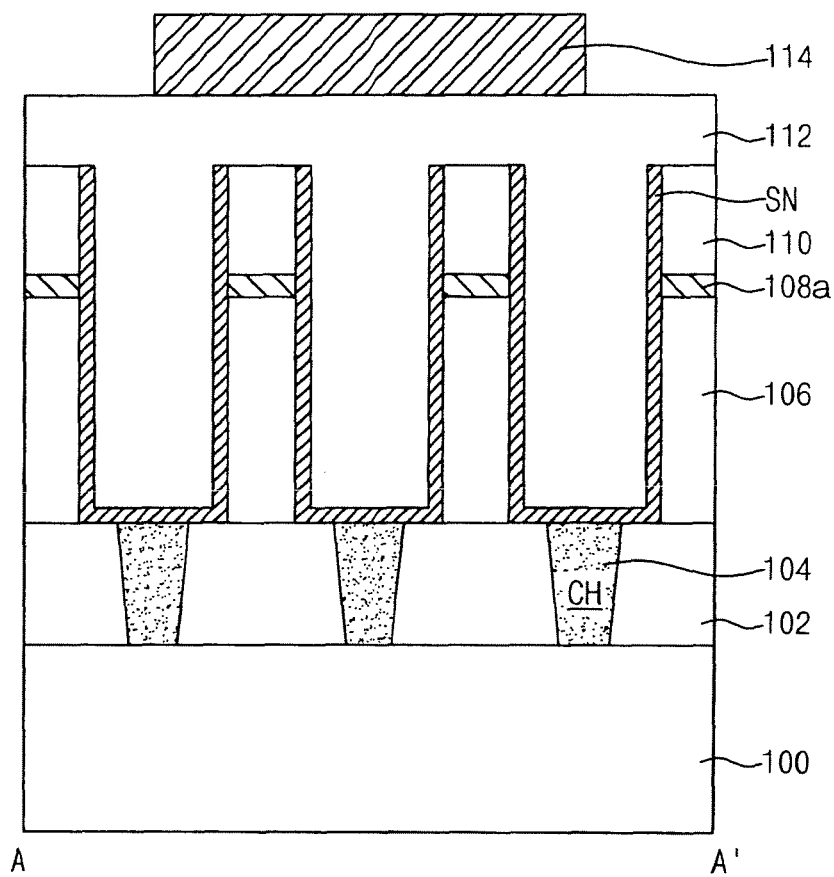

Referring to FIG. 3F, a capping layer 112 is formed on the second insulation layer 110, including the storage nodes SN, of the semiconductor substrate 100 which is annealed as described above. The capping layer 112 is formed as an oxide layer prevents the oxidation of the storage nodes SN. The oxide layer is formed, for example, as any one of a PE-TEOS layer and an ALD —$SiO_2$ layer. Preferably, the oxide layer is formed at a low temperature. Mask patterns 114 are formed on the capping layer 112 having the shape of an 'L' when viewed from the top (see the reference numeral 108 in FIG. 2).

Figure 3G:
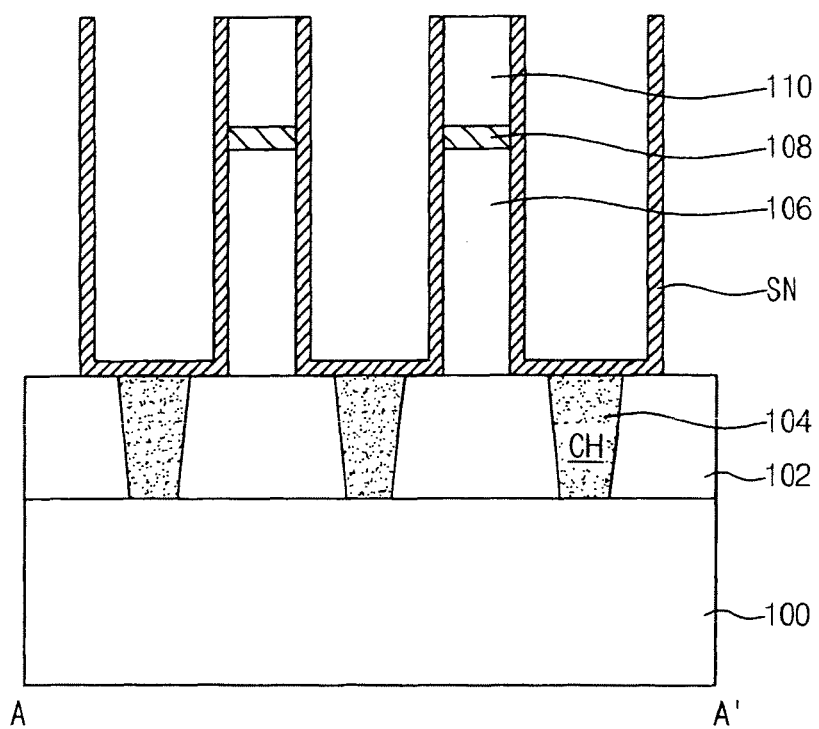

Referring to FIG. 3G, support patterns 108 are formed to fix the storage nodes SN by etching the capping layer 112, the second insulation layer 110, the support layer 108a and the first insulation layer 106 using the mask patterns 114 as an etch mask. Then, the mask patterns 114 and the capping layer 112 are removed.

Thus, the support patterns 108 are formed to fix the storage nodes SN in the form of an 'L' when viewed from the top. Also, each of the support patterns 108 are formed to fix 8 to 16 storage nodes SN by adjoining one to another.

Figure 3H:
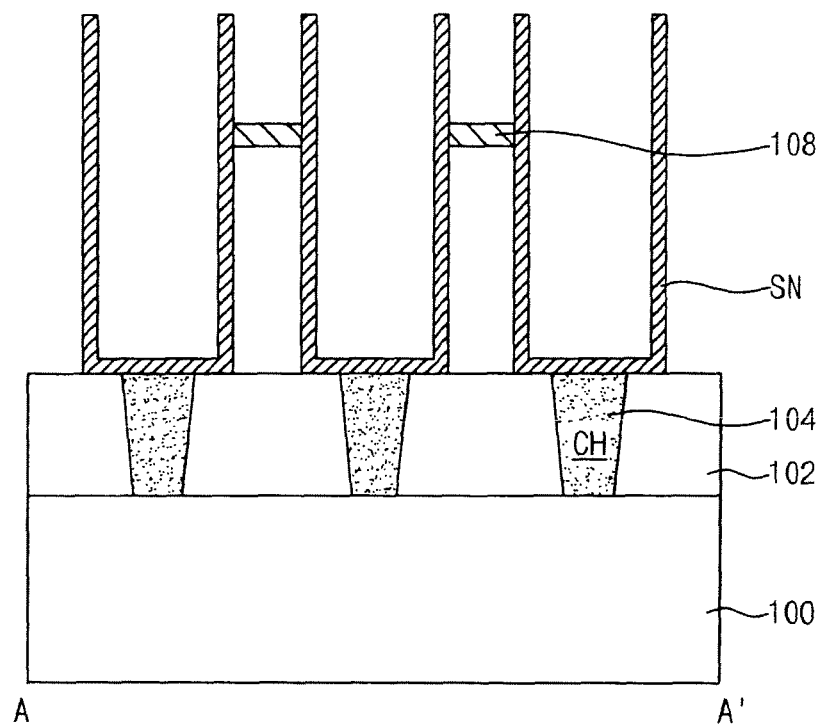

Referring to FIG. 3H, after the support patterns 108 are formed, the remaining second insulation layer 110 and first insulation layer 106 are removed. The removal of the second insulation layer 110 and the first insulation layer 106 is performed, for example, through a wet dip-out process.

Thereafter, while not shown in the drawings, after forming a dielectric layer and plate nodes over the storage nodes SN including the support patterns 108, a series of well-known subsequent process are sequentially conducted. After the completion of the subsequent processes, the manufacture of a semiconductor device in accordance with an embodiment of the present invention is completed.

As described above, in the above-described embodiments of the present invention, support patterns are formed to fix storage nodes in the form of an 'L' when viewed from the top. Therefore, the storage nodes are prevented from leaning. Thus, in the present invention, the capacitance of capacitors are effectively secured while preventing of the storage nodes from leaning. Also, the manufacturing yield of a semiconductor device is increased.

Moreover, in the present invention, because the support patterns fix the storage nodes in the form of an 'L' when viewed from the top, the stress applied to the storage nodes when subsequently forming a dielectric layer and plate nodes can be decreased. Accordingly, the stressed applied to the storage nodes of the present invention will be less than 25% of the stress applied to the storage nodes when compared to the conventional art. In the conventional art support patterns are formed to fix storage nodes in the form of a straight line, where stress of 2.59 GPa is generally applied to the storage nodes. In contrast, in the present invention, the support patterns are formed to fix the storage nodes in the form of an 'L' when viewed from the top has a stress of 0.607 GPa or 0.619 GPa that is generally applied to the storage nodes. Accordingly, in the present invention, cracks are prevented from occurring due to the less stress. Also, in the present invention, breakdown voltages are decreased from leaks in the capacitors.

While it was described in the above embodiments that the support patterns are formed to fix the storage nodes in the form of an 'L' when viewed from the top so as to prevent the storage nodes from leaning. Alternatively, in another embodiment, support patterns are formed to fix storage nodes in the form of a '+' when viewed from the top to prevent the storage nodes from leaning.

Figure 4:
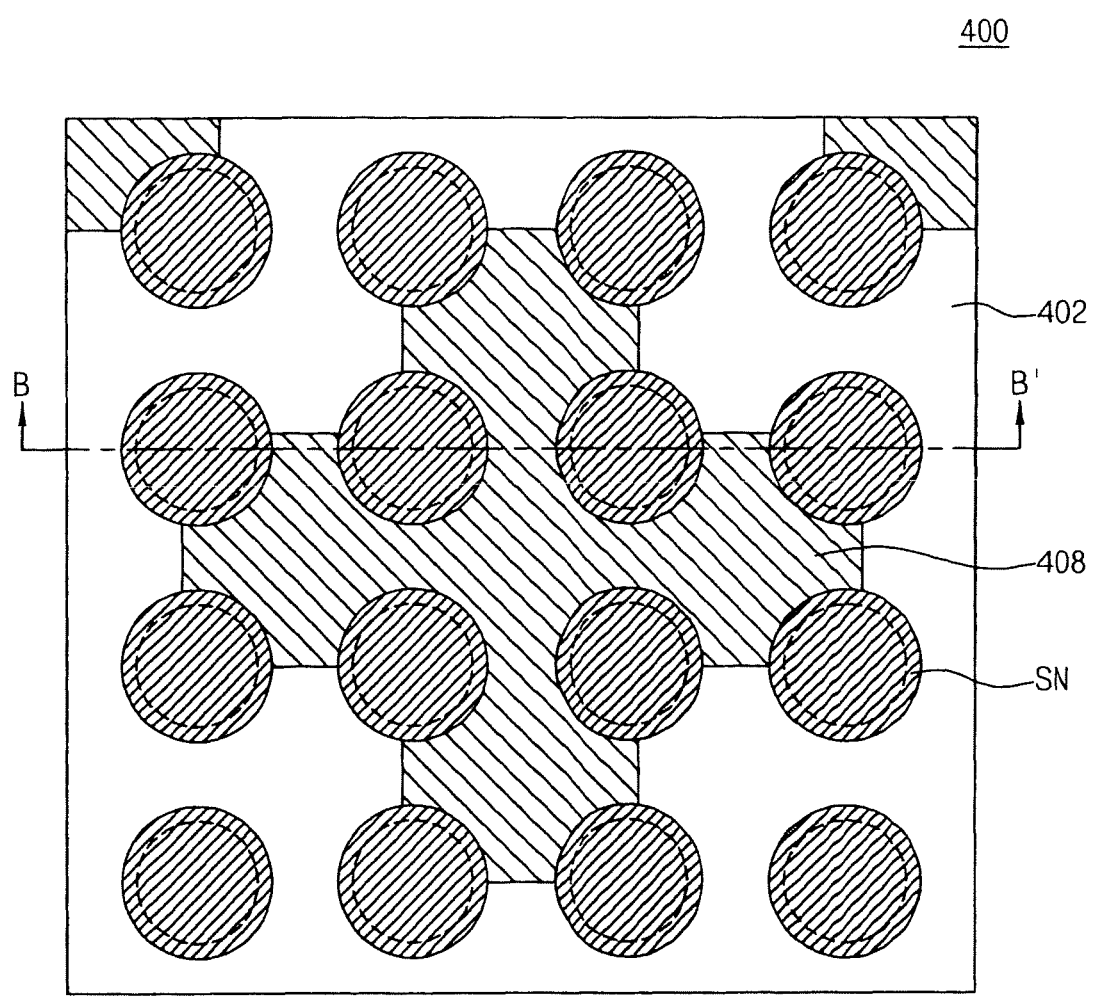
FIG. 4 is a plan view illustrating a semiconductor device in accordance with still another embodiment of the present invention.

FIG. 4 is a plan view illustrating a semiconductor device in accordance with another embodiment of the present invention.

Referring to FIG. 4, an interlayer dielectric 402 is formed on a semiconductor substrate 400, and storage node contact plugs (not shown) are formed in the interlayer dielectric 402. A plurality of cylinder-shaped storage nodes SN are formed on the storage node contact plugs. Support patterns 408 are formed on the semiconductor substrate 400 which is formed with the storage node contact plugs and the storage nodes SN, to fix the storage nodes SN in the form of a '+' when viewed from the top. Here, the support patterns 408 comprise any one of a nitride layer and an undoped polysilicon layer and are formed each to fix 10 to 18 storage nodes SN, preferably, 12 storage nodes SN.

Therefore, the semiconductor device in accordance with an embodiment of the present invention has the support patterns 408 which fix the storage nodes SN in the form of a '+' when viewed from the top. Thus, in the present invention, the storage nodes SN are prevented from leaning.

FIGS. 5A through 5H are sectional views taken along the line B-B' of FIG. 4, illustrating the processes of a method for manufacturing a semiconductor device in accordance with an embodiment of the present invention.

Figure 5A:
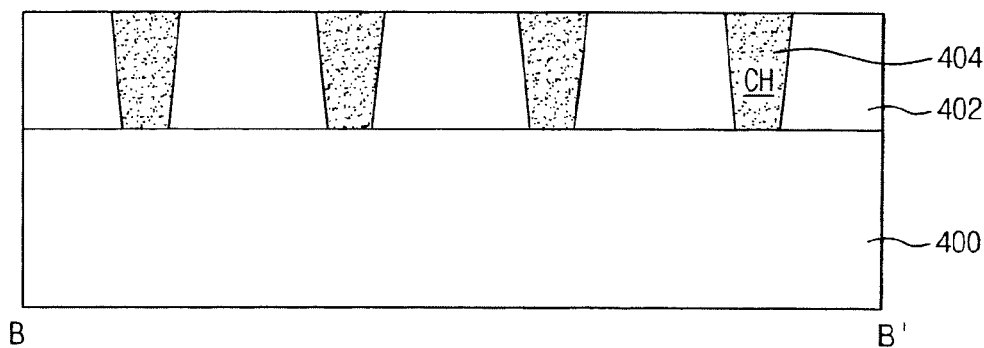
FIGS. 5A through 5H are sectional views taken along the line B-B' of FIG. 4, illustrating the processes of a method for manufacturing a semiconductor device in accordance with a still further embodiment of the present invention.

Referring to FIG. 5A, contact holes CH are defined by etching the interlayer dielectric 402 after forming an interlayer dielectric 402 on a semiconductor substrate 400. A conductive layer, for example, a polysilicon layer is formed on the interlayer dielectric 402 to fill the contact holes CH. Preferably, the polysilicon layer is formed, for example, through a CVD process. Then, by etching back the polysilicon layer formed on the interlayer dielectric 402, storage node contact plugs 404 are formed in the contact holes CH.

Figure 5B:
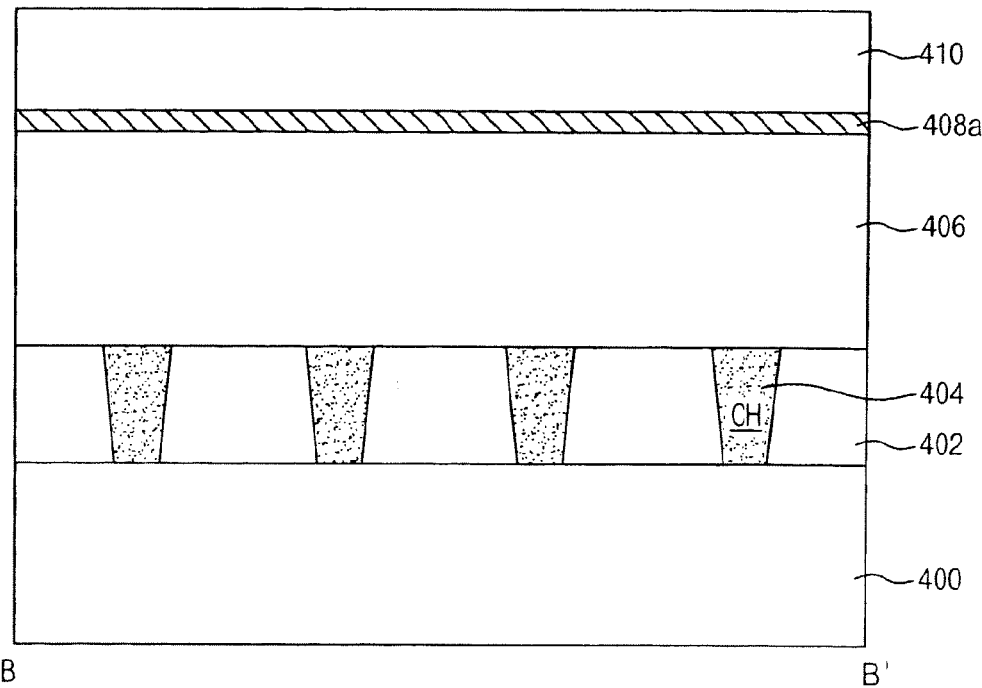

Referring to FIG. 5B, a first insulation layer 406, a support layer 408a and a second insulation layer 410 are formed on the storage node contact plugs 404 and the interlayer dielectric 402. The first and second insulation layers 406 and 410 comprise an oxide layer, for example, a single layer of a PSG layer or a PE-TEOS layer or a stack layer of PSG and PE-TEOS layers. Alternatively, an etch stop layer (not shown) comprising a nitride layer can be formed before forming the first insulation layer 406.

Here, the support layer 408a is formed as any one of a nitride layer and an undoped polysilicon layer. The nitride layer is formed in a furnace or through any one of PE-CVD or HDP-CVD.

Figure 5C:
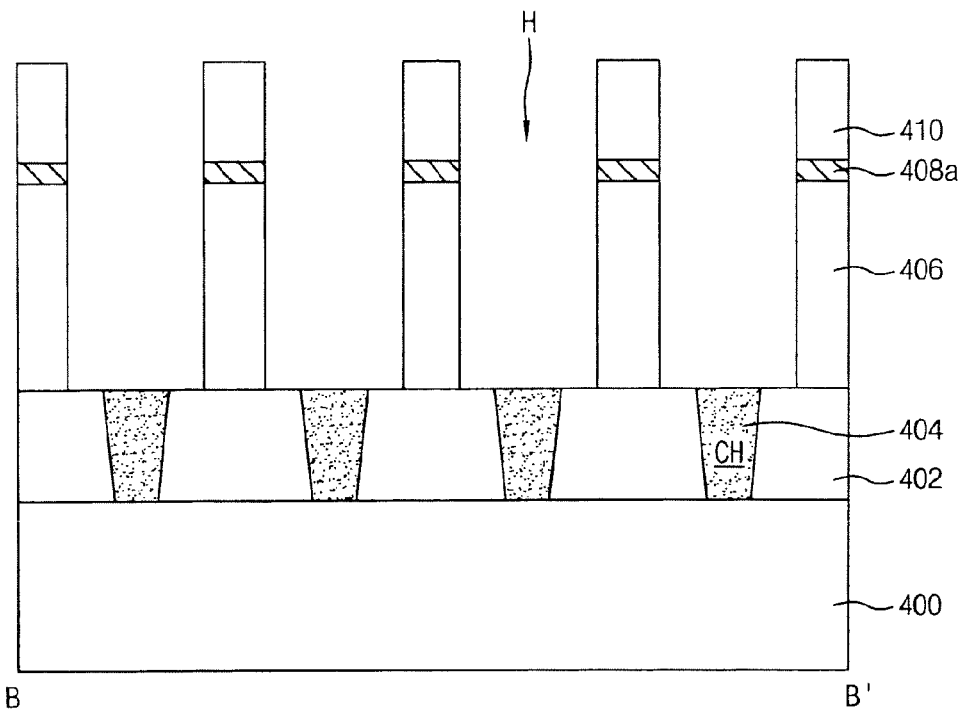

Referring to FIG. 5C, a plurality of holes H for storage nodes are defined to expose the storage node contact plugs 404 by etching the second insulation layer 410, the support layer 408a and the first insulation layer 406.

Figure 5D:
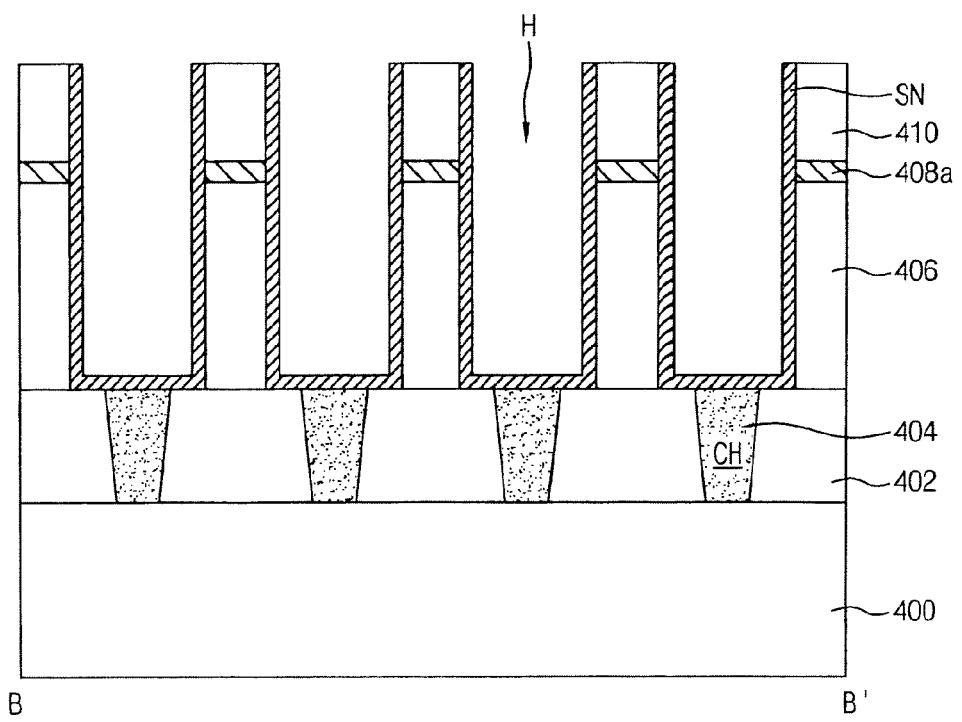

Referring to FIG. 5D, a conductive layer for storage nodes is formed on the second insulation layer 410 including the holes H for storage nodes. The conductive layer for storage nodes has the stack structure of a TiN layer and a Ti layer. The TiN layer is formed, for example, through CVD, and the Ti layer is formed for example, through PVD. Preferably, rapid thermal annealing is conducted such that a $TiSi_2$ layer (not shown) for ohmic contact is formed at an interface between the conductive layer for storage nodes and the storage node contact plugs 404.

Cylinder-shaped storage nodes SN are formed in the holes H for storage nodes by removing portions of the conductive layer for storage nodes formed on the second insulation layer 410. The removal of the portions of the conductive layer for storage nodes is performed, for example, through a CMP process or an etch-back process. The storage nodes SN are formed on the sidewalls of the second insulation layer 410, the support layer 408a and the first insulation layer 406 which delimit the holes H for storage nodes and on the storage node contact plugs 404.

Figure 5E:
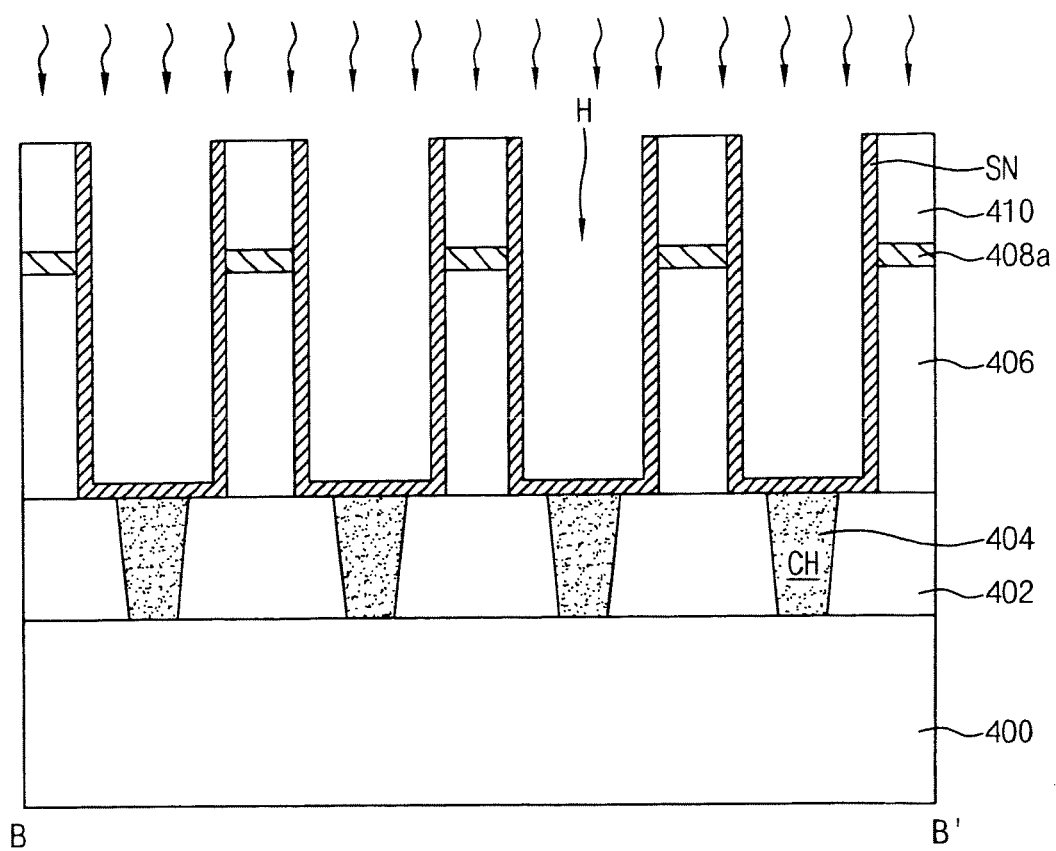

Referring to FIG. 5E, the semiconductor substrate 400 which is formed with the storage nodes SN is annealed. The annealing is conducted to remove impurities, such as Cl, contained in the storage nodes SN. The annealing decreases the stress produced from to the rapid thermal annealing when forming the $TiSi_2$ layer for ohmic contact. Preferably, the annealing is conducted in an $N_2$ atmosphere.

Figure 5F:
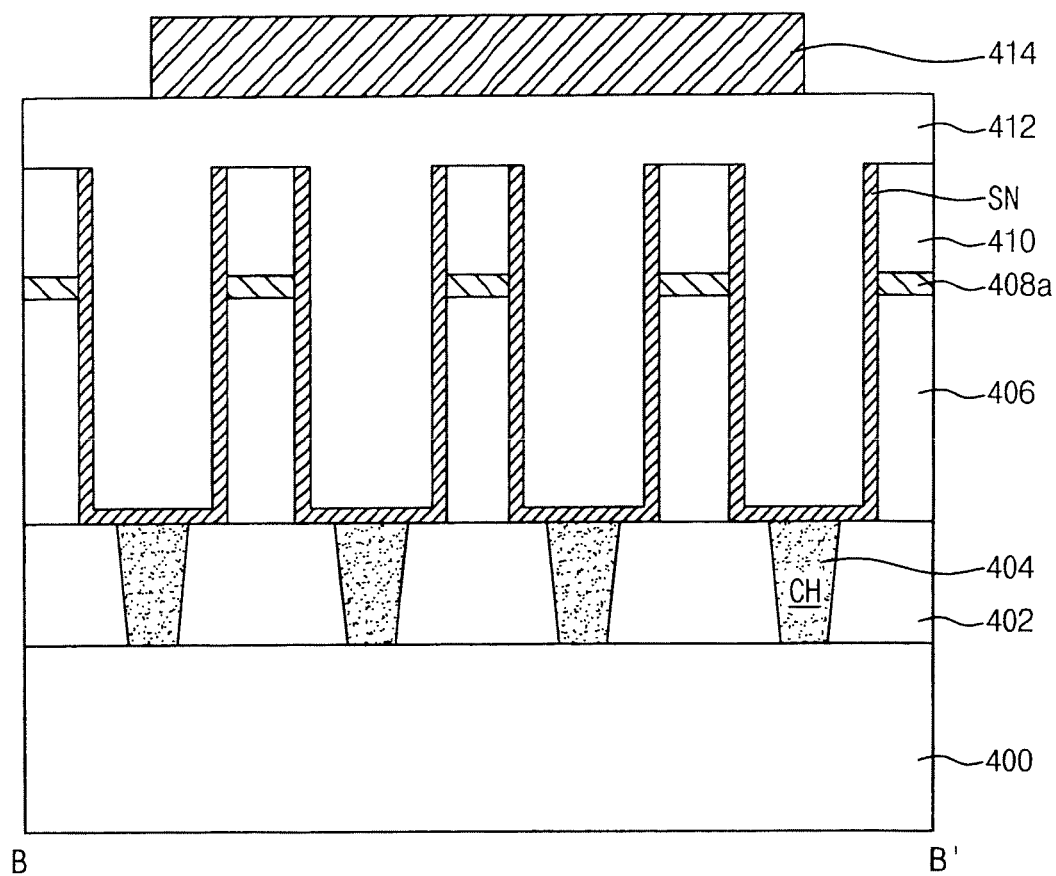

Referring to FIG. 5F, a capping layer 412 is formed on the second insulation layer 410, including the storage nodes SN, of the semiconductor substrate 400 which is annealed as described above. The capping layer 412 is formed as an oxide layer that prevents oxidation of the storage nodes SN. The oxide layer is formed, for example, as any one of a PE-TEOS layer and an $ALD-SiO_2$ layer. Preferably, the oxide layer is formed at a low temperature. Mask patterns 414 are formed on the capping layer 412 having the shape of a '+' when viewed from the top (see the reference numeral 408 in FIG. 4).

Figure 5G:
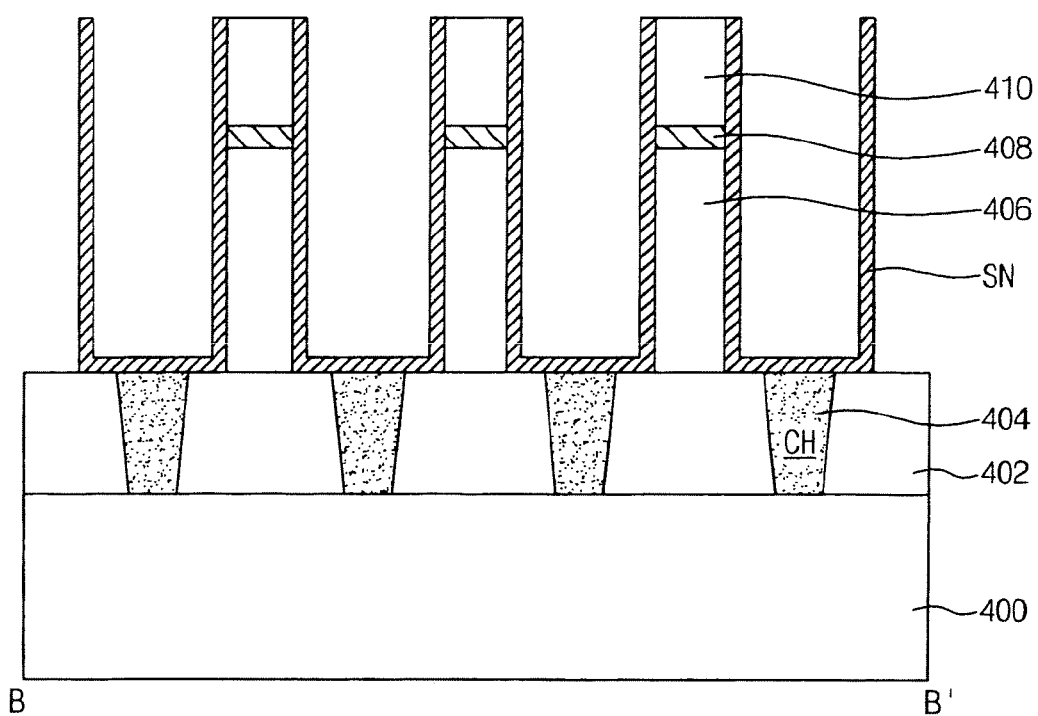

Referring to FIG. 5G, by etching the capping layer 412, the second insulation layer 410, the support layer 408a and the first insulation layer 406 using the mask patterns 414 as an etch mask, support patterns 408 are formed to fix the storage nodes SN. Then, the mask patterns 414 and the capping layer 412 are removed.

Here, the support patterns 408 are formed to fix the storage nodes SN in the form of a '+' when viewed from the top. Also, each of the support patterns 408 are formed to fix 10 to 18, preferably, 12 storage nodes SN by adjoining one to another.

Figure 5H:
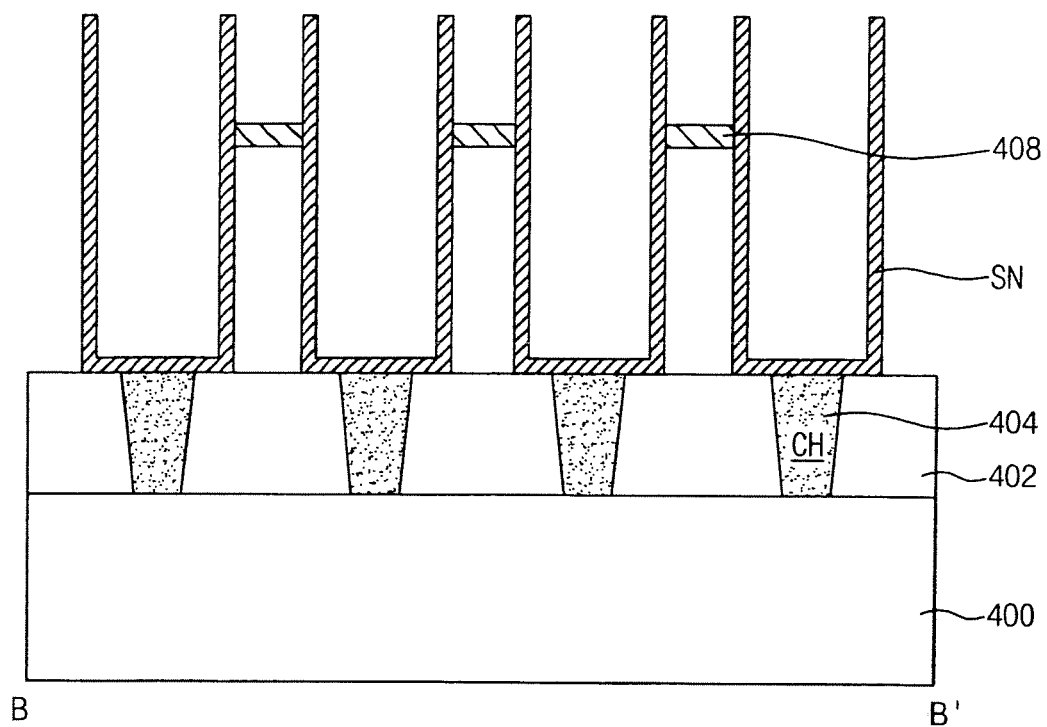

Referring to FIG. 5H, after the support patterns 408 are formed, the remaining second insulation layer 410 and first insulation layer 406 are removed. The removal of the second insulation layer 410 and the first insulation layer 406 is performed, for example, through a wet dip-out process.

Thereafter, while not shown in the drawings, after forming a dielectric layer and plate nodes over the storage nodes SN including the support patterns 408. Then, a series of well known subsequent processes are sequentially conducted, wherein the manufacture of a semiconductor device in accordance with the an embodiment of the present invention is completed.

As described above, in the above-described embodiments of the present invention, support patterns are formed to fix storage nodes in the form of a '+' when viewed from the top. Therefore, in the present invention, the storage nodes are prevented from leaning and the capacitance from leaking.

Although specific embodiments of the present invention have been described for illustrative purposes, those skilled in the art will appreciate that various modifications, additions and substitutions are possible, without departing from the scope and the spirit of the invention as disclosed in the accompanying claims.

What is claimed is:

1. A semiconductor device comprising:
   a plurality of cylinder-shaped storage nodes formed over a semiconductor substrate; and
   support patterns formed to partially fix only some storage nodes selected from the storage nodes in a form of an 'L' when viewed from above,
   wherein the storage nodes and the support patterns are divided into a plurality of groups separated from each other, wherein each of the groups comprise a support pattern selected from the support patterns and storage nodes fixed by the selected support pattern, and
   wherein the support pattern formed to contacts only outer surface of the storage node.

2. The semiconductor device according to claim 1, wherein the support patterns comprise any one of a nitride layer and an undoped polysilicon layer.

3. The semiconductor device according to claim 1, wherein the support patterns are formed such that each of the support patterns fixes a plurality of at least 8 storage nodes together.

4. A method for manufacturing a semiconductor device, comprising the steps of:
   forming an insulation layer having a stack structure wherein a support layer is placed, over a semiconductor substrate;
   defining a plurality of holes by etching the insulation layer and the support layer;
   forming cylinder-shaped storage nodes in the holes;
   forming support patterns by etching the insulation layer and the support layer to partially fix only some storage nodes selected from the storage nodes in the form of an 'L' when viewed from above, so as to form a plurality of groups separated from each other, wherein each of groups comprise a support pattern selected from the support patterns and storage nodes fixed by the selected support pattern, and
   wherein the support pattern formed to contacts only outer surface of the storage node; and
   removing the remaining insulation layer after forming the support patterns.

5. The method according to claim 4, wherein the support layer is formed as any one of a nitride layer and an undoped polysilicon layer.

6. The method according to claim 5, wherein the nitride layer is formed in a furnace or through plasma-enhanced chemical vapor deposition (PE-CVD) or high density plasma chemical vapor deposition (HDP-CVD).

7. The method according to claim 4, wherein, after the forming the storage nodes and before the forming the support patterns, the method further comprises:
  annealing the semiconductor substrate which is formed with the storage nodes.

8. The method according to claim 4, wherein the step of forming the support patterns comprises:
  forming a capping layer on the insulation layer including the storage nodes;
  forming mask patterns on the capping layer having an 'L' shape when viewed from above;
  etching portions of the capping layer, the insulation layer and the support layer using the mask patterns as an etch mask; and
  removing the mask patterns and the capping layer.

9. The method according to claim 8, wherein the capping layer is formed as an oxide layer.

10. The method according to claim 4, wherein the support patterns are formed such that each of the support patterns fixes a plurality of at least 8 storage nodes together.

11. A semiconductor device comprising:
  a plurality of cylinder-shaped storage nodes formed over a semiconductor substrate; and
  support patterns formed to partially fix only some storage nodes selected from the storage nodes in the form of a '+' when viewed from above,
  wherein the storage nodes and the support patterns are divided into a plurality of groups separated from each other, wherein each of the groups comprise a support pattern selected from the support patterns and storage nodes fixed by the selected support pattern, and
  wherein the support pattern formed to contacts only outer surface of the storage node.

12. The semiconductor device according to claim 11, wherein the support patterns comprise any one of a nitride layer and an undoped polysilicon layer.

13. The semiconductor device according to claim 11, wherein the support patterns are formed such that each of the support patterns fixes a plurality of at least 8 storage nodes together.

14. A method for manufacturing a semiconductor device, comprising:
  forming an insulation layer having a stack structure wherein a support layer is placed, over a semiconductor substrate;
  defining a plurality of holes by etching the insulation layer and the support layer;
  forming cylinder-shaped storage nodes in the holes;
  forming support patterns by etching the insulation layer and the support layer to partially fix only some storage nodes selected from the storage nodes in the form of a '+' when viewed from above, so as to form a plurality of groups separated from each other, wherein each of the groups comprise a support pattern selected from the support patterns and storage nodes fixed by the selected support pattern, and
  wherein the support pattern formed to contacts only outer surface of the storage node; and
  removing the remaining insulation layer after forming the support patterns.

15. The method according to claim 14, wherein the support layer is formed as any one of a nitride layer and an undoped polysilicon layer.

16. The method according to claim 15, wherein the nitride layer is formed in a furnace or through plasma-enhanced chemical vapor deposition (PE-CVD) or high density plasma deposition chemical vapor deposition (HDP-CVD).

17. The method according to claim 14, wherein, after the forming the storage nodes and before the forming the support patterns, the method further comprises:
  annealing the semiconductor substrate which is formed with the storage nodes.

18. The method according to claim 14, wherein the forming the support patterns comprises:
  forming a capping layer on the insulation layer including the storage nodes;
  forming mask patterns on the capping layer having a '+' shape when viewed from above;
  etching portions of the capping layer, the insulation layer and the support layer using the mask patterns as an etch mask; and
  removing the mask patterns and the capping layer.

19. The method according to claim 18, wherein the capping layer is formed as an oxide layer.

20. The method according to claim 14, wherein the support patterns are formed such that each of the support patterns fixes a plurality of at least 8 storage nodes together.

* * * * *